US006773951B2

(12) United States Patent
Eriksen et al.

(10) Patent No.: US 6,773,951 B2
(45) Date of Patent: Aug. 10, 2004

(54) METHOD OF MANUFACTURE OF A SEMICONDUCTOR STRUCTURE

(75) Inventors: Odd Harald Steen Eriksen, Minneapolis, MN (US); Shuwen Guo, Lakeville, MN (US)

(73) Assignee: Rohr, Inc., Chula Vista, CA (US)

( * ) Notice: Subject to any disclaimer, the term of this patent is extended or adjusted under 35 U.S.C. 154(b) by 0 days.

(21) Appl. No.: 10/278,611

(22) Filed: Oct. 23, 2002

(65) Prior Publication Data

US 2003/0040136 A1 Feb. 27, 2003

Related U.S. Application Data

(62) Division of application No. 09/932,001, filed on Aug. 17, 2001, now Pat. No. 6,566,158.

(51) Int. Cl.[7] .......................... H01L 21/00; H01L 21/30; H01L 21/46
(52) U.S. Cl. ........................ 438/53; 438/50; 438/455; 438/459
(58) Field of Search ........................... 438/50, 53, 455, 438/459, 931

(56) References Cited

U.S. PATENT DOCUMENTS

| | | | |
|---|---|---|---|
| 5,374,564 A | 12/1994 | Bruel | 437/24 |
| 5,515,732 A | 5/1996 | Willcox et al. | 73/724 |
| 5,759,908 A | * | 6/1998 | Steckl et al. | 438/479 |
| 5,798,293 A | 8/1998 | Harris | 438/459 |
| 5,877,070 A | 3/1999 | Goesele et al. | 438/458 |
| 5,882,987 A | 3/1999 | Srikrishnan | 438/458 |
| 5,953,622 A | 9/1999 | Lee et al. | 438/458 |
| 6,140,210 A | 10/2000 | Aga et al. | 438/458 |
| 6,326,285 B1 | 12/2001 | Behfar et al. | 438/455 |
| 6,355,541 B1 | 3/2002 | Holland et al. | 438/459 |
| 6,391,799 B1 | * | 5/2002 | Di Cioccio | 438/781 |

OTHER PUBLICATIONS

Di Cioccio et al. "SiC on insulator Formation by the Smart–Cut Process", Materials Science and Engineering B, vol. 46, No. 1–3, pp. 349–356 (4/77).*

(List continued on next page.)

Primary Examiner—Alexander Ghyka
(74) Attorney, Agent, or Firm—Goodwin Procter LLP

(57) ABSTRACT

A method of preparing a semiconductor structure comprises:
(a) providing a first material comprising (i) a first wafer comprising silicon, (ii) at least one SiC conversion layer obtained by converting a portion of the silicon to SiC, (iii) at least one layer of non-indigenous SiC applied to the conversion layer, and (iv) at least one oxide layer applied to the non-indigenous SiC layer;
(b) implanting ions in a region of the non-indigenous SiC layer, thereby establishing an implant region therein which defines a first portion of the non-indigenous SiC layer and a second portion of the non-indigenous SiC layer;
(c) providing at least one additional material comprising (i) a second wafer comprising silicon, and (ii) an oxide layer applied to a face of the second wafer;
(d) bonding the oxide layer of the first material and oxide layer of the material to provide an assembly of the first material and second material; and
(e) separating at the implant region the second portion of the non-indigenous SiC layer from the first portion of the non-indigenous SiC layer to provide. The resultant semiconductor structure comprises a base wafer which may be a Si wafer, an insulating oxide layer which may be $SiO_2$ adjacent to the base wafer, and an active top layer of non-indigenous SiC. The semiconductor structure may be used to fabricate integrated electronics, pressure sensors, temperature sensors or other instrumentation which may be used in high temperature environments such as aircraft engines.

14 Claims, 10 Drawing Sheets

OTHER PUBLICATIONS

Steckl et al. "SiC SOI Structures by Direct Carburization Conversion and Post–growth from silacyclobutane", J. Electrochem. Soc., vol. 141, pp L66–L68 (1994).*

Vinod et al., "Fabrication of Low Defect Density 3C–SIC on $SiO_2$ Structures Using Water Bonding Techniques," J. Electronic Materials, vol. 27, pp. L17–20 (1998).

Tong et al., "Si and SiC layer transfer by high temperature hydrogen implantation and lower temperature layer splitting," Electronic Letters, vol. 34, pp. 407–408 (Feb. 1998).

Steckl et al., "SiC Silicon–on–Insulator Structures by Direct Carbonization Conversion and Postgrowth from Silacyclobutane," J. Electrochem. Soc., vol. 141, pp. L66–L68 (1994).

Fleischman et al., "Epitaxial growth of 3C–SIC films on 4–inch diameter (100) silicon wafers by APCVD," presented at *Silicon Carbide and Related Materials 1995 Conference*, (Kyoto, Japan), pp. 197–200 (1995).

Wu et al., "The Microstructure and Surface Morphology of Thin 3C–SiC Films Grown on (100) Si Substrates Using an APCVD–Based Carbonization Process," Materials Science Forum, vols. 353–356, pp. 167–170 (2001).

Hobart et al., "Compliant Substrates: A Comparative Study of the Relaxation Mechanisms of Strained Films Bonded to High and Low Viscosity Oxides," J. of Electronic Materials, vol. 29, No. 7, pp. 897–900 (2000).

Yin et al., "Strain Relaxation of SiGe Islands on Compliant Oxide," J. of Applied Physics, vol. 91, No. 12, pp. 9716–9722 (2002).

L. DiCiccio et al., "Silicon Carbide on Insulator Formation By the Smart–Cut Process," Materials Science and Engineering B, vol. 46, No. 1–3, pp. 349–356 (Apr. 1977).

Wu et al., "The Microstructure and Surface Morphology of Thin 3C–SiC Films Grown on (100) Si Substrates Using an APCVD–Based Carbonization Process," Materials Science Forum, vol. 353–56, pp. 167–170 (2001).

Bruyere et al., "Defect Studies in Epitaxial SiC–6H Layers on Insulator (SiCOI)," Microelectronic Engineering, vol. 48, No. 1–4; pp. 277–280 (Sep. 1999).

Reichert et al., "β–SiC Films on SOI Substrates For High Temperature Applications," Diamond and Related Materials, vol. 6, No. 10, pp. 1448–1450 (Aug. 1997).

* cited by examiner

FIG. 1A
FIG. 1B
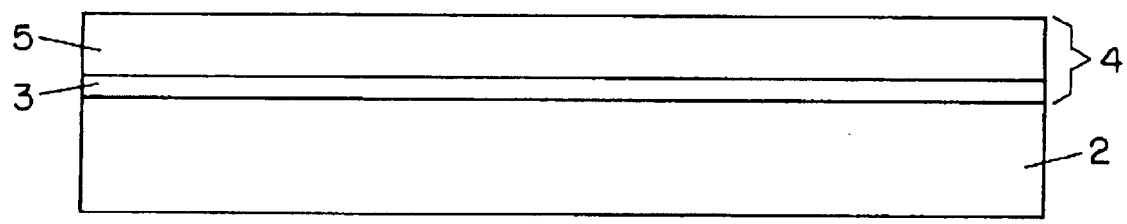
FIG. 1C
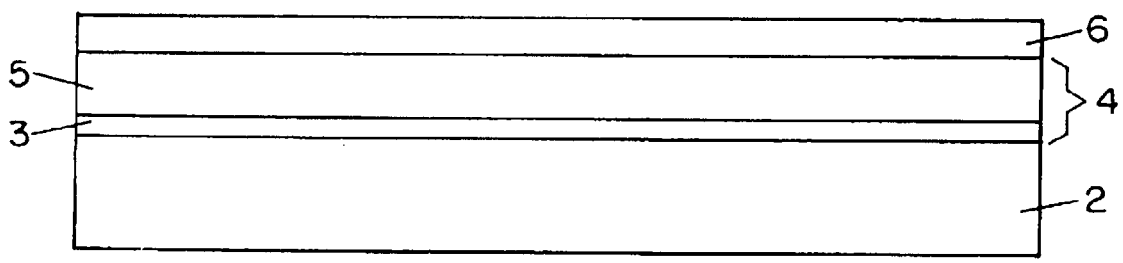
FIG. 1D
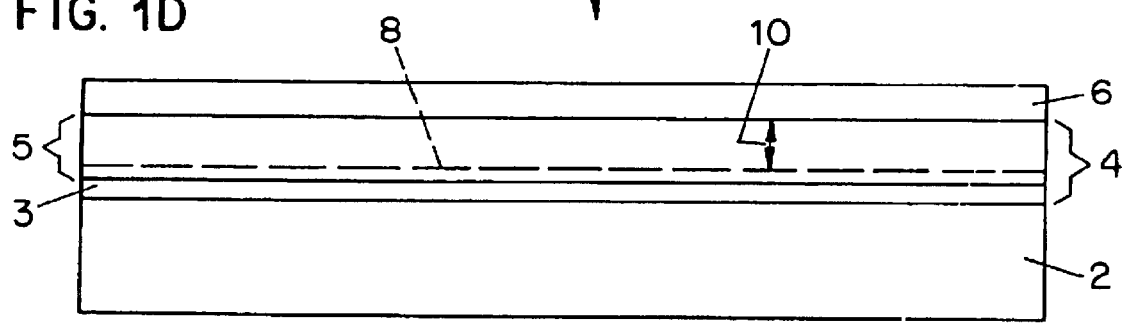

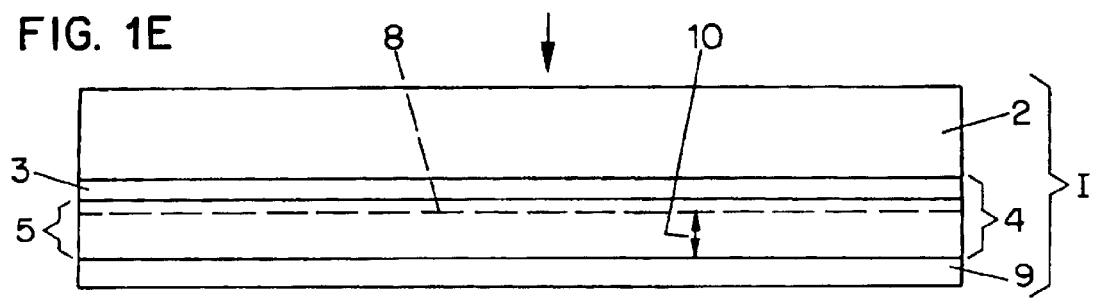
FIG. 1E
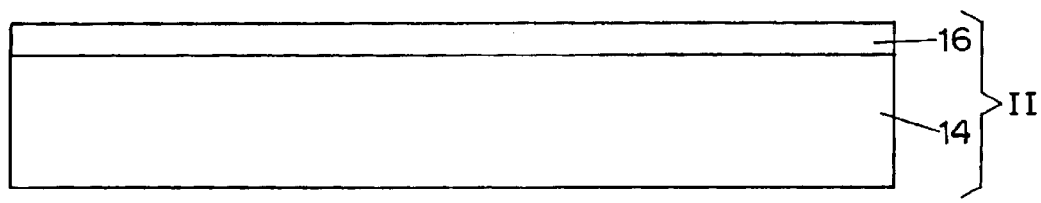
FIG. 1F
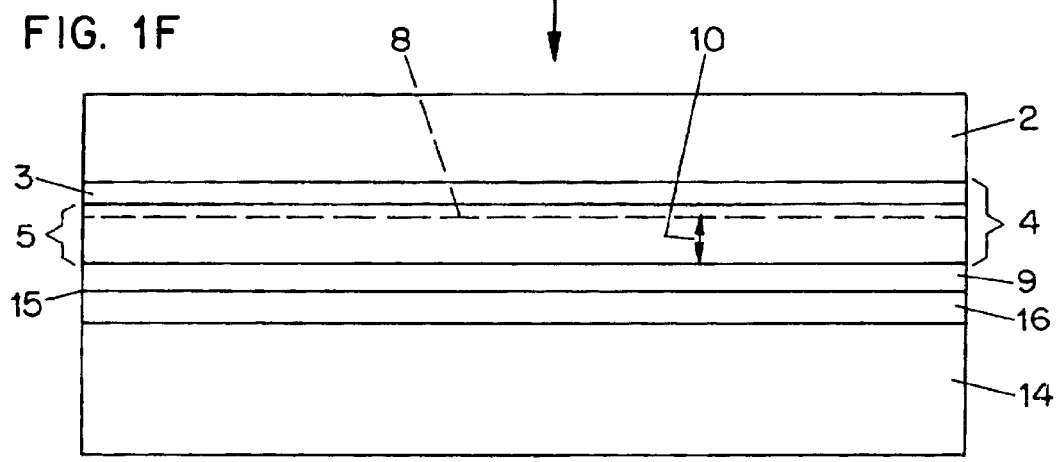
FIG. 1G
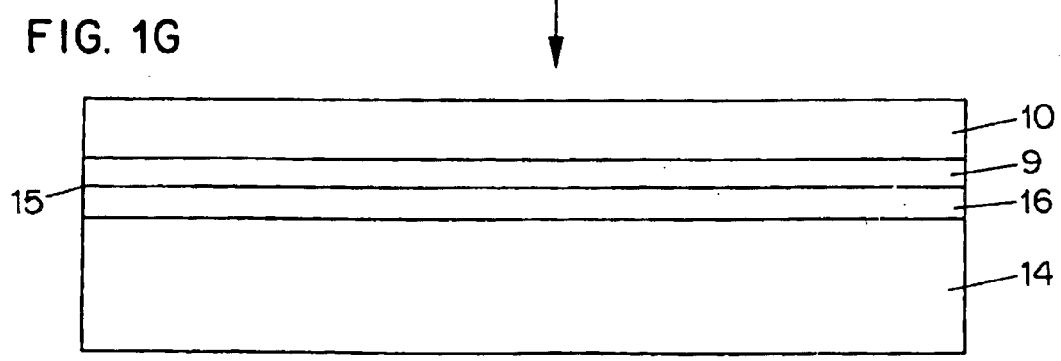

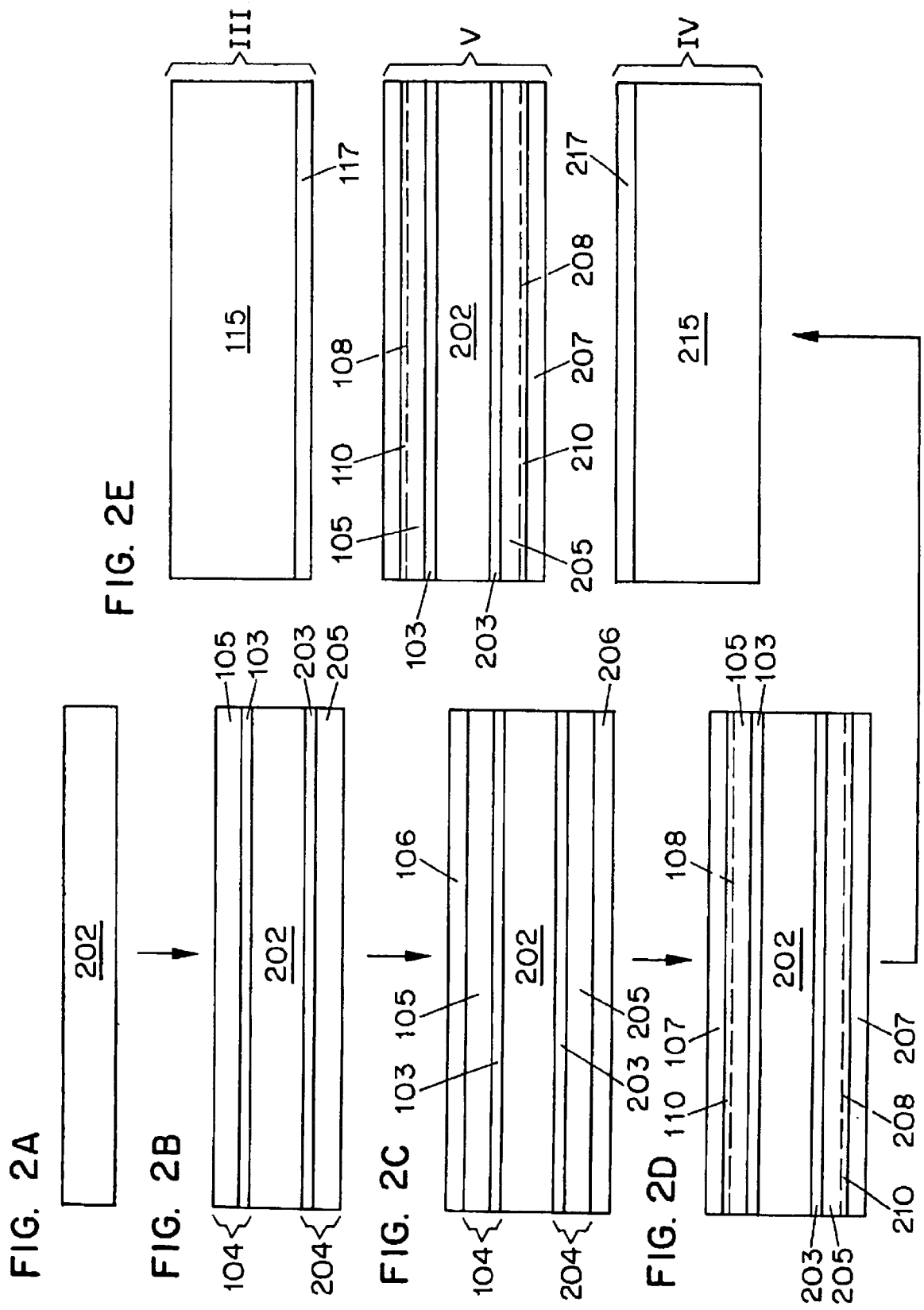

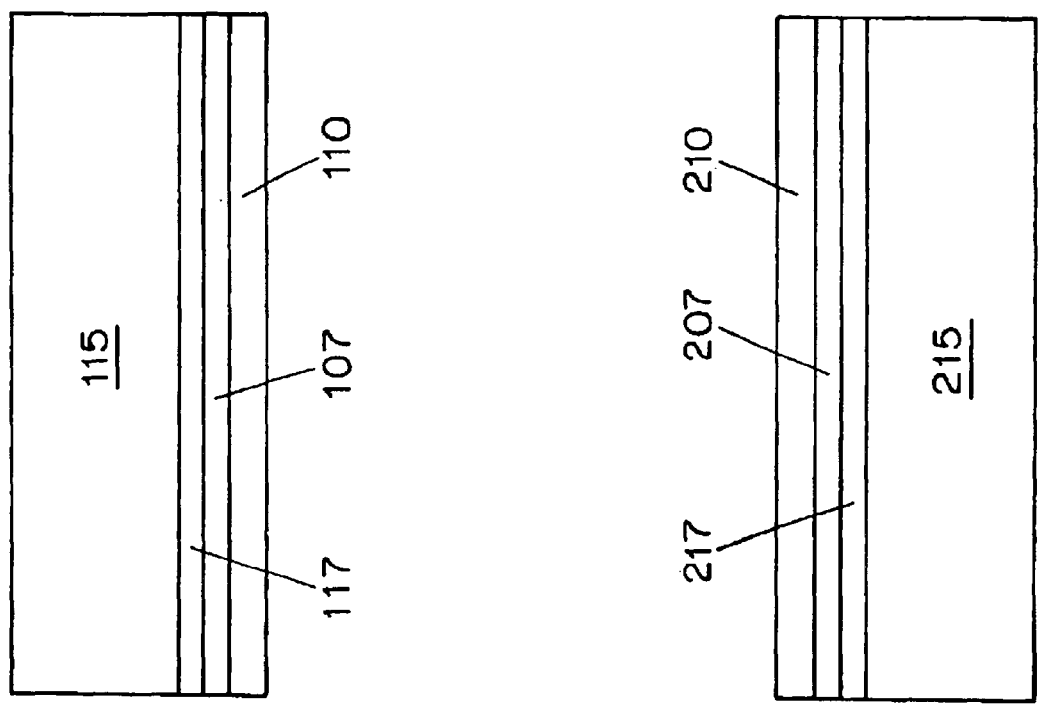
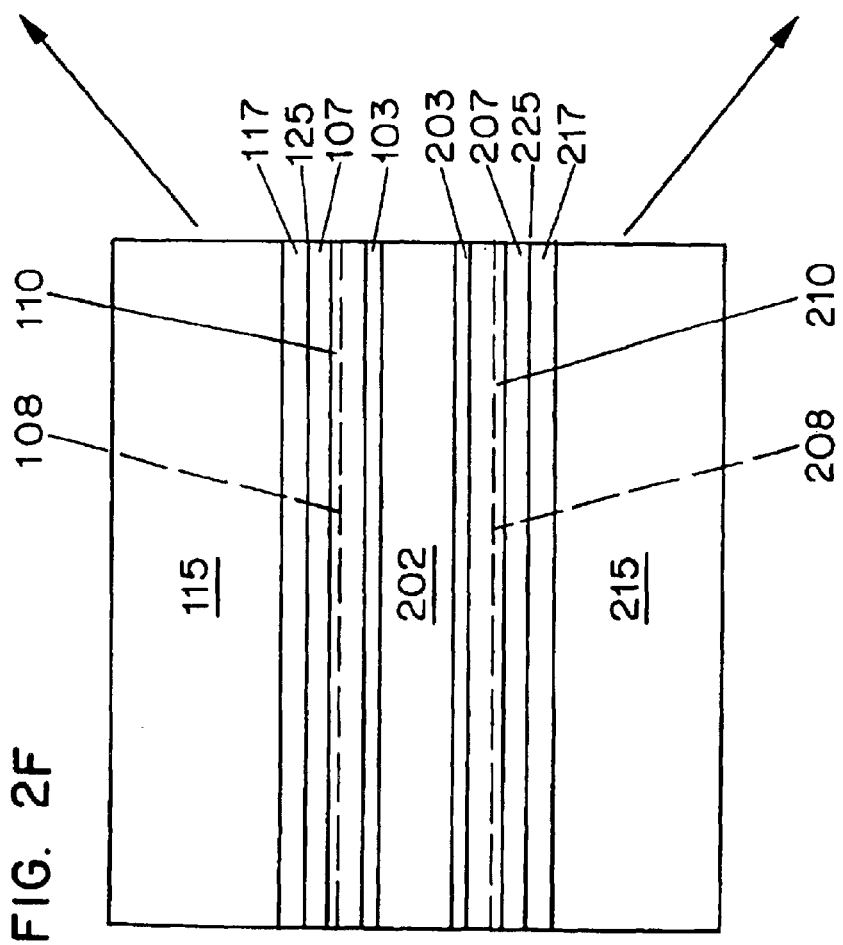

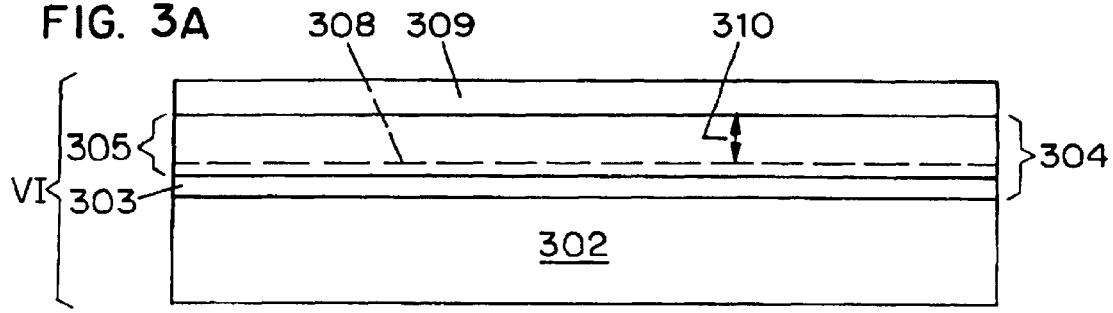
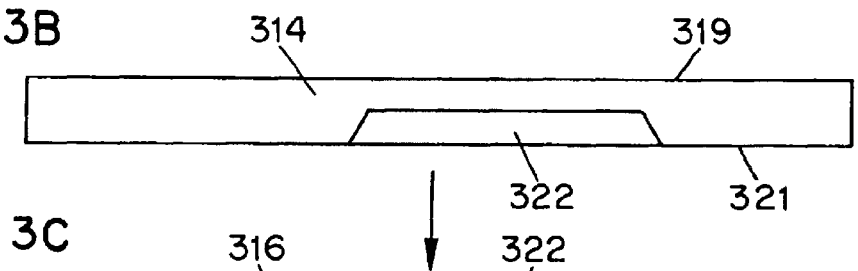
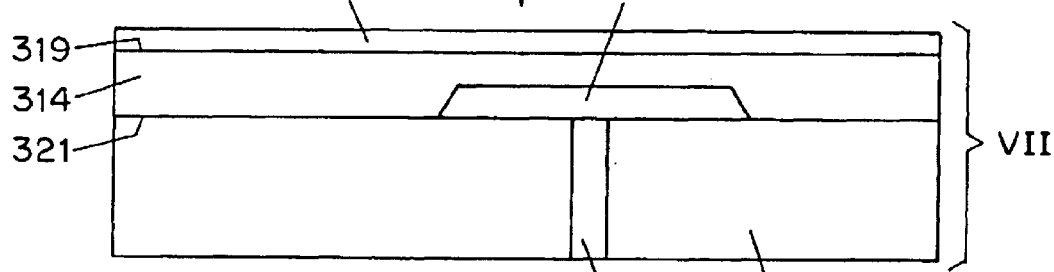
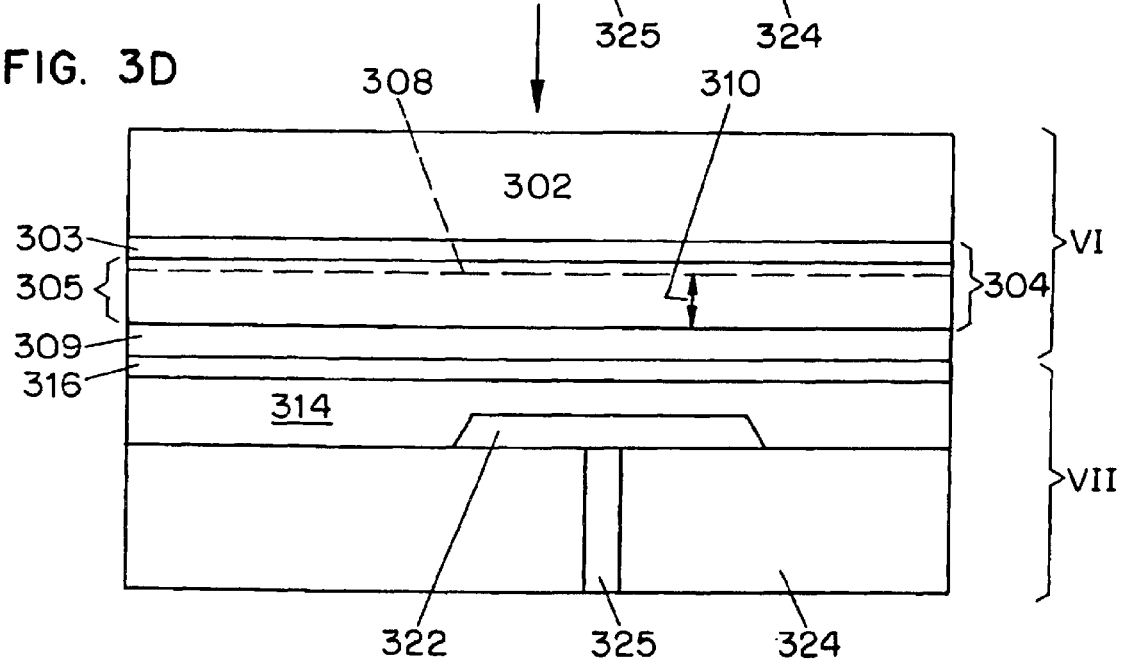

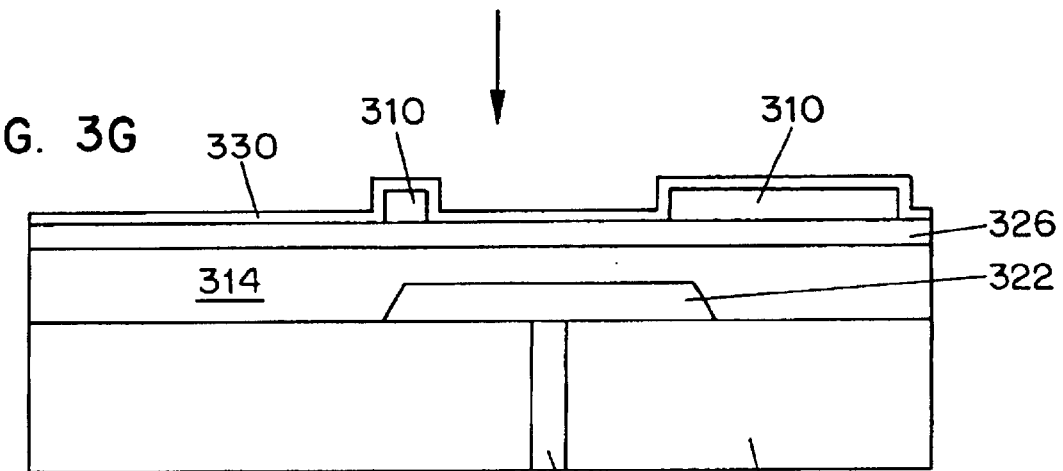
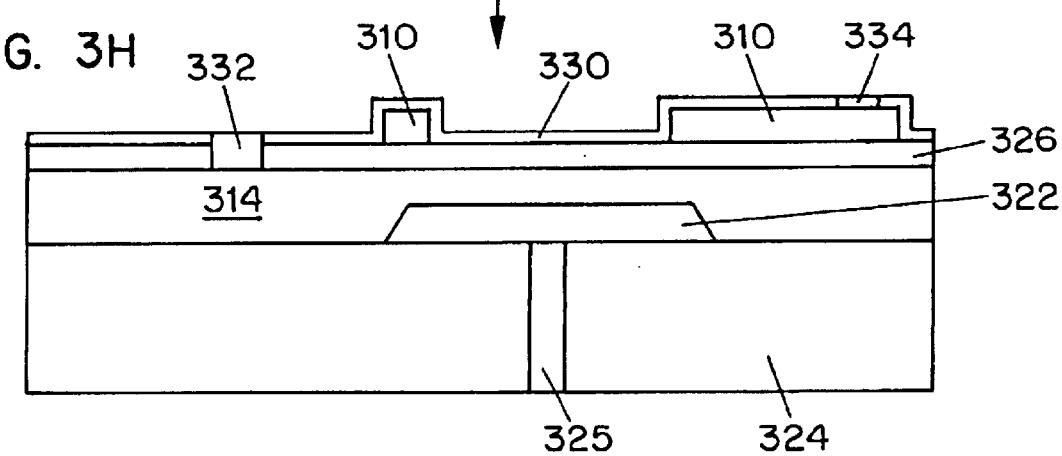
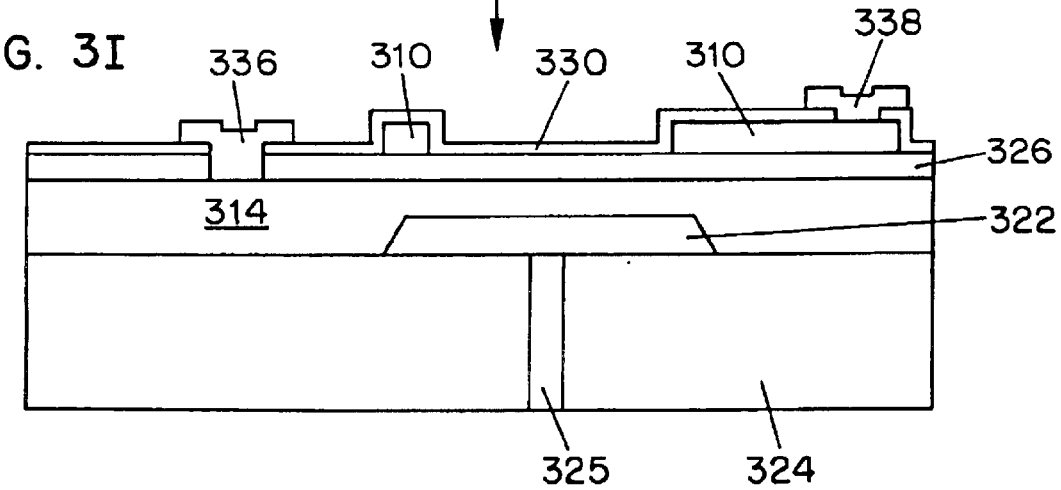

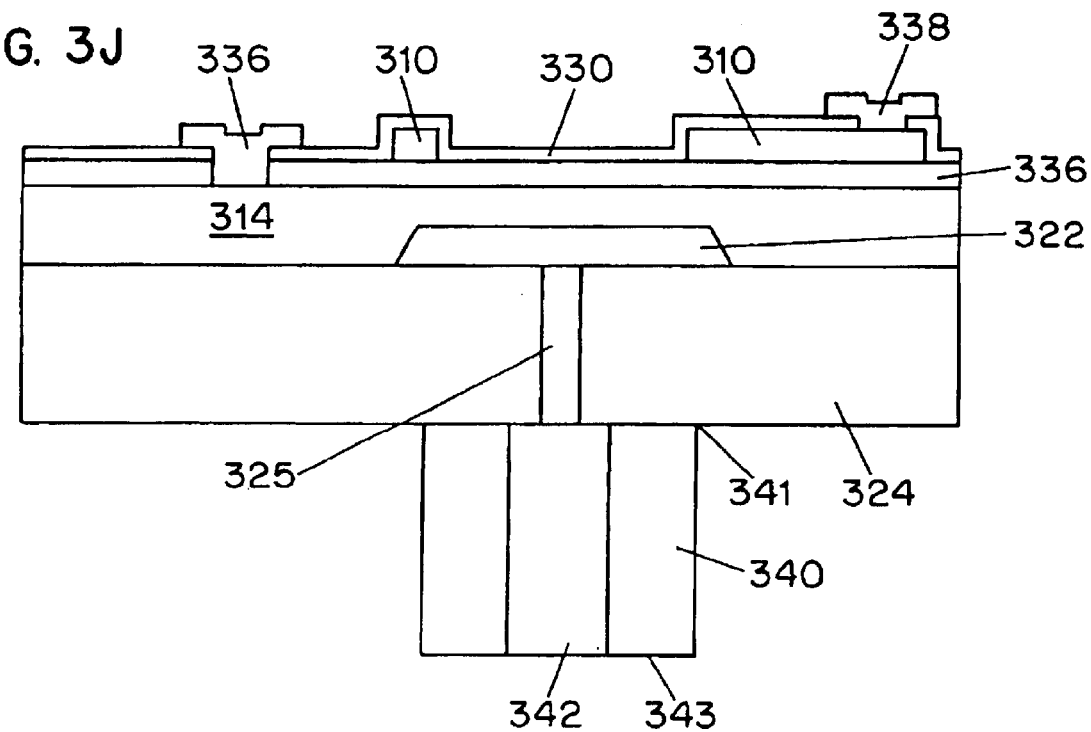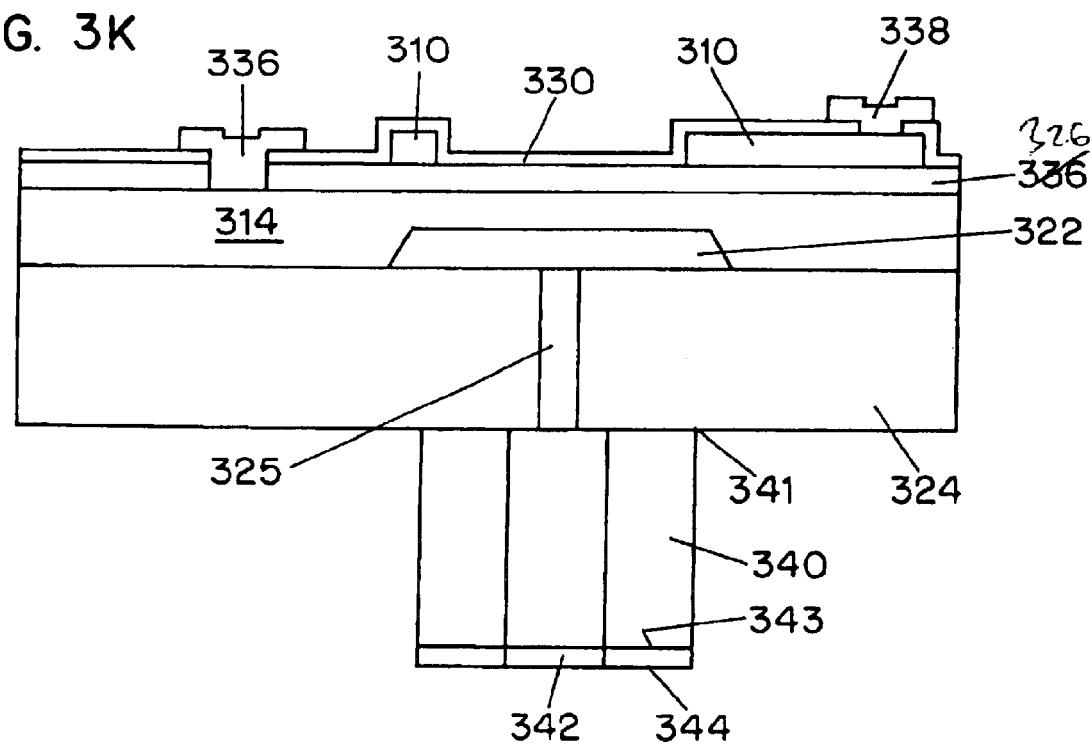

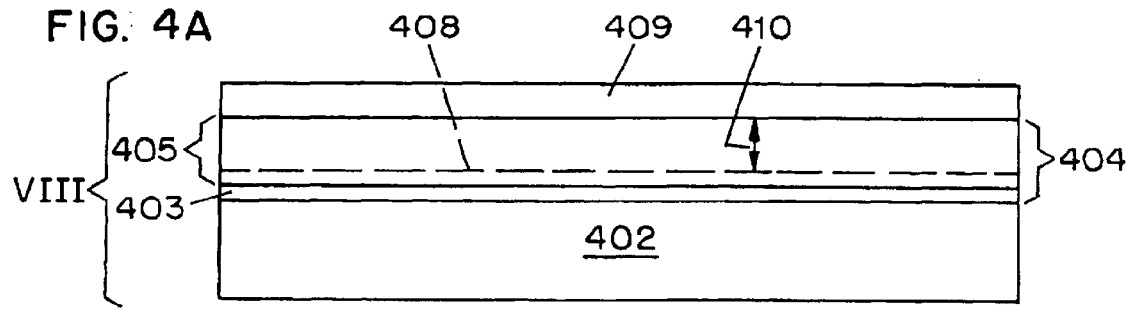
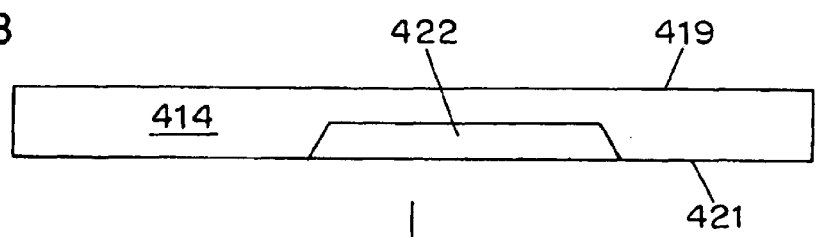
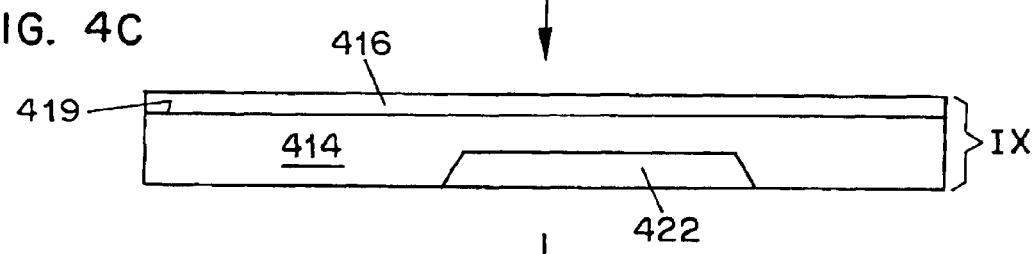
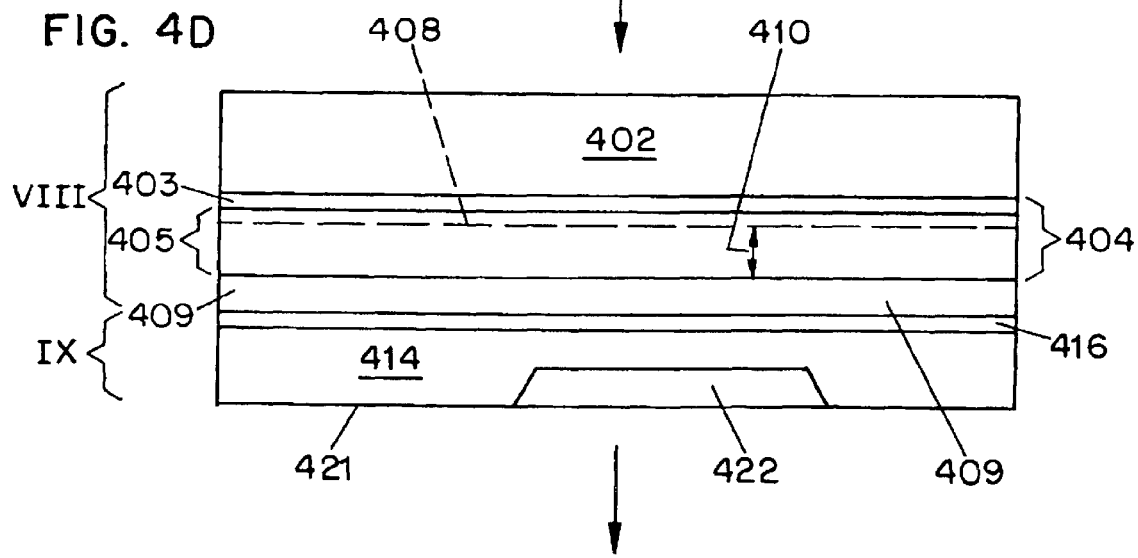

METHOD OF MANUFACTURE OF A SEMICONDUCTOR STRUCTURE

CROSS-REFERENCE TO RELATED APPLICATION

This application is a divisional application of U.S. patent application Ser. No. 09/932,001, filed Aug. 17, 2001 now U.S. Pat. No. 6,566,158.

BACKGROUND OF THE INVENTION

1. Field of the Invention

This invention is directed to a method of manufacturing a semiconductor structure. More particularly, this invention is directed to a method of manufacturing a semiconductor structure to obtain a structure comprising a Si base, at least one insulating layer residing on the Si base, and a SiC layer residing on the insulating layer, in which the SiC layer is non-indigenous to the Si base. The semiconductor structure may be employed, for example, in the fabrication of high temperature instrumentation such as high temperature electronics and sensors for use in environments such as aircraft engines.

2. Background Information

The use of layers of semiconductor materials in the manufacture of sensing elements such as pressure sensors is well known to those skilled in the art. Such sensing elements are typically fabricated from one or more thin semiconductor layers residing on a thick support structure. The thin semiconductor layer or layers may be obtained by bonding the semiconductor material to a support wafer (e.g. a Si wafer), with an intermediate insulating layer residing therebetween. The semiconductor material is then thinned, typically via etching or grinding, to the desired thickness.

For high temperature sensor applications semiconductor materials such as silicon carbide (SiC), gallium nitride (GaN) and diamond are of particular interest, due to the wide band gap of such materials. More particularly, as disclosed, for example, in U.S. Pat. No. 5,798,293 (Harris), the cubic form 3C polytype of single crystal SiC (3C—SiC) is an advantageous semiconductor material. However, such materials are typically difficult to process, as they tend to be hard, brittle, fragile and chemically resistant. In particular, although SiC is a preferred material for use in high temperature sensor applications, SiC is very hard and chemically resistant, which makes fabrication of the sensing element difficult. For example, bonding of SiC wafers requires flat and smooth wafer surfaces, yet polishing SiC surfaces to achieve sufficient flatness and surface finish is difficult due to the hardness of SiC. Moreover, even if bonding of the SiC surface is accomplished, thinning of the SiC layer via conventional grinding or a combination of chemical and mechanical etching or polishing remains difficult.

Various other techniques are known for fabricating desired composite semiconductor material structures. For example, a thin film of active material (e.g. Si or SiC) may be placed on a "handle" wafer. Thereafter, insulating layers may be applied to both the active material thin layer and a separate "base" wafer. The insulating layers are then bonded or annealed to form a single structure, and the "handle" wafer is removed via etching, grinding or polishing or a combination thereof to yield a structure having a base wafer, an active top layer, and an insulating layer therebetween.

However, because of the disadvantages of etching, grinding and polishing techniques to remove excess Si material (such as the "handle" wafer), other semiconductor material fabrication methods have been developed. For example, in the so-called "SMART-CUT" process, described in U.S. Pat. No. 5,374,564 (Bruel), which is incorporated herein by reference, a thin semiconductor material film is prepared by bombarding a face of a semiconductor wafer material (e.g. a monocrystalline Si wafer) with hydrogen ions to a depth close to the average penetration depth of ions into the wafer, thereby defining an upper wafer portion (i.e. a thin film) and a lower wafer portion (i.e. the substrate). A stiffener constituting at least one rigid material layer is brought into contact with the planar face of the thin film portion of the wafer, and the wafer-stiffener assembly is thereafter thermally treated, thereby causing separation of the thin film from the substrate by the formation and coalescence of hydrogen filled microcracks.

Similarly, a method of fabricating a 3C—SiC semiconductor layer on a $SiO_2$ insulating layer is described by K. Vinod et al. in "Fabrication of Low Defect Density 3C—SiC on $SiO_2$ Structures Using Wafer Bonding Techniques," *J. of Electronic Materials*, Vol. 27, pp. L17–20 (1998) (referred to herein as Vinod et al.), which is incorporated herein by reference. The paper describes the fabrication of a 3C—SiC on $SiO_2$ structure in which etching is employed to expose a SiC surface on an $SiO_2$ layer.

In view of the above-described problems associated with the use of grinding, polishing and etching techniques to obtain the desired SiC active layer, it would be desirable to employ a method of manufacturing semiconductor structures having a SiC active layer residing on an insulating layer which avoids the use of such techniques.

It is one object of this invention to provide a method of preparing a semiconductor structure having a SiC active layer residing on an insulating layer which is prepared by using a handle wafer which is removed without etching, grinding or polishing. It is yet another object of this invention to provide high temperature pressure sensors, high temperature sensors and integrated electronics prepared from the semiconductor structure of this invention, as well as a method of preparing such sensors and integrated electronics.

It is one feature of this invention that a handle wafer is prepared having a Si substrate, at least one SiC active layer applied to the substrate, and an insulating layer applied to the SiC active layer. The handle wafer is bombarded with ions and the ions are implanted to a desired depth within the SiC active layer. At least one base wafer having an insulating layer is also provided, and the insulating layers of the handle and base wafers are bonded, thereby forming a single structure. Upon thermal treatment of the structure as described in the "SMART-CUT" process as described in U.S. Pat. No. 5,374,564 (Bruel), the Si substrate and a portion of each SiC layer of the handle wafer is removed, yielding at least one semiconductor structure having a base wafer, an oxide insulating layer residing on the base wafer, and a top SiC active layer residing on the insulating layer.

The method of this invention advantageously may employ thicker wafers which tend to remain flat and facilitate bonding thereto. In addition, the method of this invention advantageously permits the manufacture of large diameter (say 4 inches in diameter) SiC on insulator (SiCOI) having excellent crystal properties which are obtained without using etching. Other objects, features and advantages of this invention will be apparent to those skilled in the art in view of the detailed description of the invention provided below.

SUMMARY OF THE INVENTION

The method of this invention comprises:

providing a first material comprising (i) a first (i.e. handle) wafer comprising silicon, (ii) at least one SiC conversion layer obtained by converting a portion of the silicon from the handle wafer to SiC, (iii) at least one layer of non-indigenous SiC applied to the conversion layer, and (iv) at least one oxide layer applied to the non-indigenous SiC layer, wherein a region of the non-indigenous SiC layer has ions implanted therein, thereby establishing an implant region therein which defines a first portion of the non-indigenous SiC layer and a second portion of the non-indigenous SiC layer;

providing at least one additional material comprising (i) a second (i.e. base wafer) comprising silicon, and (ii) an oxide layer applied to a face of the base wafer;

bonding the oxide layer of the first material and oxide layer of the additional material to provide an assembly of the first material and additional material; and separating at the implant region the second portion of the non-indigenous SiC layer from the first portion of the non-indigenous SiC layer, thereby providing at least one semiconductor structure having a silicon base, at least one oxide insulating layer thereon, and a non-indigenous SiC active top layer residing on the oxide insulating layer. The semiconductor structure obtained from the method of this invention may be used to fabricate integrated electronics, temperature sensors, pressure sensors or other instrumentation which may be used in high temperature environments such as aircraft engines.

BRIEF DESCRIPTION OF THE DRAWINGS

FIGS. 1A–1G depict cross-sectional views of one embodiment of the method of this invention.

FIGS. 2A–2G depict cross-sectional views of another specific embodiment of the method of this invention, in which two semiconductor structures of this invention are simultaneously prepared.

FIGS. 3A–3K depict cross-sectional views of a specific embodiment of this invention, in which a pressure sensor is fabricated.

FIGS. 4A–4E depict cross-sectional views of another specific embodiment of this invention, in which a pressure sensor is fabricated.

DETAILED DESCRIPTION OF THE INVENTION

Figure 3E:
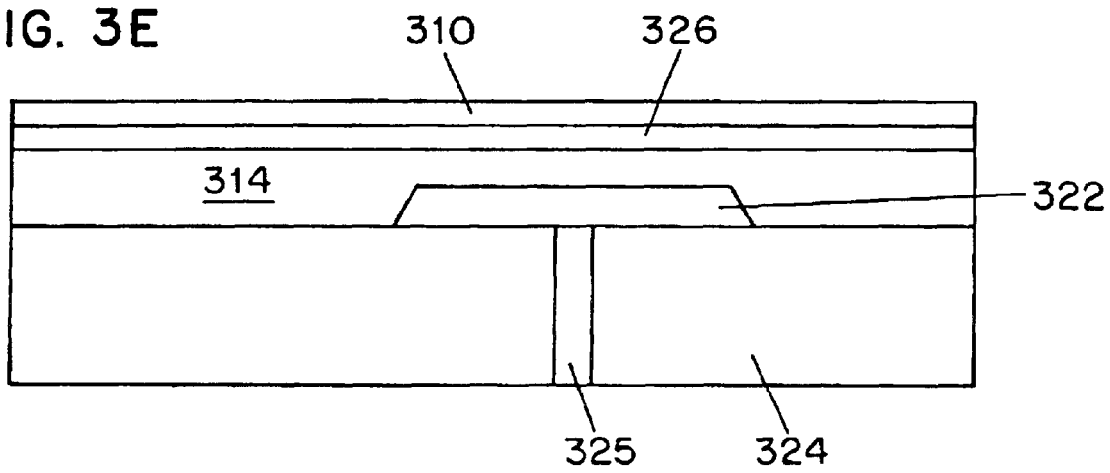

The present invention combines the desirable aspects of the use of a SiC film on a Si "handle" wafer, as described in Vinod et al., and the SMART-CUT process as described in U.S. Pat. No. 5,374,564 (Bruel) to obtain a semiconductor structure having a Si base layer, an oxide insulating layer thereon, and a SiC top layer residing on the oxide insulating layer. This structure is obtained while avoiding the use of etching, grinding or polishing to remove the Si handle wafer from the SiC film by employing the ion implantation technique of the SMART-CUT process to achieve removal of the Si handle wafer. The present invention preserves the cost advantage of the SMART-CUT process and extends it to more easily and reliably obtain an SiC active layer residing on an oxide insulating layer: i.e. a SiCOI substrate in which a monocrystalline SiC film resides on at least one insulating layer which insulates the SiC film from the underlying base layer or substrate.

The invention is described in greater detail herein relative to non-limiting embodiments of the invention and with reference to the drawings. FIGS. 1A–G show cross sectional views of the various method steps employed in one embodiment of the invention to prepare the desired semiconductor structure. In FIG. 1A, a first or "handle" wafer 2 which is a Si wafer having a thickness of about 0.3–1.2 mm, say about 1 mm is shown. FIG. 1B depicts the handle wafer 2 having a SiC layer 4 applied to a face of the handle wafer 2. The SiC layer 4 has a total thickness of about 0.5–1.5 $\mu$m, say 1 $\mu$m. SiC layer 4 comprises an initial conversion layer 3 and an epitaxial layer 5 residing thereon. The conversion layer 3 is a 3C—SiC layer having a thickness of about 100 Angstroms which is indigenous to the handle wafer 2 and is obtained by converting a portion of Si wafer 2 to 3C—SiC as described, for example, by Wu et al. in "The Microstructure and Surface Morphology of Thin 3C—SiC Films Grown on (100) Si Substrates Using an APCVD-Based Carbonization Process," *Materials Science Forum*, Vols. 353–356, pp. 167–70 (2001), which is incorporated herein by reference. This is followed by application of an epitaxial layer 5 of additional SiC (which is not indigenous to the handle wafer) upon the converted SiC layer 3 using a chemical vapor deposition process such as atmospheric pressure chemical vapor deposition (APCVD) as described, for example, by Fleishman et al. in "Epitaxial Growth of 3C—SiC Films on 4-inch Diameter (100) Silicon Wafers by APCVD," presented at the Silicon Carbide and Related Materials 1995 Conference, Kyoto, Japan, pp. 197–200. Epitaxially grown SiC layer 5 is advantageous in that it provides a virtually defect-free SiC layer for use in the semiconductor structure of this invention, because defects in the SiC crystals remain in the portion of the SiC layer 4 which remains integral to the discarded handle wafer, as further described herein.

FIG. 1C depicts an oxide layer 6 applied to SiC layer 4. The oxide layer 6 is preferably a $SiO_2$ layer which has been obtained by techniques known to those skilled in the art, including thermal oxidation or chemical vapor deposition (CVD), preferably CVD, as will be well understood by those skilled in the art. Plasma enhanced chemical vapor deposition (PECVD) is particularly preferred to obtain oxide layer 6. The oxide layer 6 typically has a thickness of about 1000 Angstroms.

In FIG. 1D, the substrate of FIG. 1C has been subjected to ion bombardment, thereby implanting ions in an implant region 8 (shown in dashed lines) which is located in the epitaxial SiC layer 5. Implantation must be performed such that above the implant region 8 is at least a portion 10 of the epitaxial SiC layer 5 and the oxide layer 6 adjacent to portion 10, and below the implant region 8 is the conversion SiC layer 3, and the handle wafer 2 adjacent thereto. The ions employed may be hydrogen gas ions and possibly other ions alone or in combination such as boron, carbon, phosphorus, nitrogen, arsenic or fluorine ions, most preferably hydrogen gas ions. Ion implantation may be accomplished via techniques and equipment well known to those skilled in the art, such as the method described in U.S. Pat. No. 5,374,564 (Bruel) at col. 5, line 8-col. 6 line 10, which is incorporated herein by reference. The temperature of the substrate of FIG. 1C during implantation is preferably kept below the temperature at which gas (which is produced by the implanted ions) can escape via diffusion from the substrate of FIG. 1C or its component layers. Ion implantation causes a concentrated layer of ions to form and reside in the implant region 8 at a depth close to the average penetration depth of the ions into the SiC layer 4.

The oxide layer 6 is typically damaged during the ion implantation process, and accordingly oxide layer 6 is stripped from the epitaxial SiC layer 5 after ion implantation using wet etch in buffered oxide etch (BOE) or dry etch in reactive ion etch (RIE). The epitaxial SiC layer 5 is then cleaned with SO$_5$/HF/Chelate, and PECVD is again employed to provide the ion-implanted epitaxial SiC layer 5 with a new oxide layer 9. The oxide layer 9 balances film stresses and wafer distortion, such that the original wafer flatness is retained. Subsequent polishing and cleaning of the oxide layer 9 may be achieved via the use of chemical-mechanical polishing (CMP), which is a process of using a fine polishing disc with wet chemical enhancement to achieve a fine finish on semiconductor materials (for example, silicon, oxides and nitrides), as will be well understood by those skilled in the art. The desired finish is a flatness of less than 1 micron and a surface of less than 5 Angstroms RMS.

FIG. 1E depicts the ion implanted material of FIG. 1D with new oxide layer 9 (labeled I) in proximity to a second material (labeled II) having a base wafer 14 and an oxide layer 16 applied thereto. The base wafer 14 comprises silicon, and in a preferred embodiment is a Si wafer having a thickness of about 100–5000 μm, preferably 300–1000 μm, most preferably about 300–500 μm. The oxide layer 16 is preferably a SiO$_2$ layer obtained as previously described with respect to oxide layers 6 and 9. Oxide layer 16 has a thickness of about 1–25 μm, say about 10 μm, and may be cleaned and polished using CMP as previously described with respect to oxide layer 9. Material I is shown inverted as contemplated in the method of this invention for adjoining to material II.

The oxide layers 9 and 16 of the materials I and II, respectively, are bonded as depicted in FIG. 1F to provide a single assembly. The bonded interface 15 shows the interface between the bonded oxide layers 9 and 16. The oxide layers are preferably bonded by chemically treating each oxide layer 9 and 16 by chemical activation of these surfaces followed by mechanical adjoining. As will be well understood by these skilled in the art, chemical activation is typically achieved by forming a hydrophilic surface which attaches an OH radical to the SiO$_2$ molecules residing in the oxide layers. The OH radicals on each oxide surface are attracted to each other, which aids the bonding process. The presence of moisture may also be desirable. The OH radicals are typically provided by cleaning the oxide surfaces with one or more of the following commercially available chemical surface cleaning formulations: SC-1 (hydrogen peroxide, ammonium hydroxide and deionzed water); SC-2 (hydrochloric acid, hydrogen peroxide and deionzed water); "Piranha" (sulfuric acid and hydrogen peroxide); and "Chelate" (a 1:3 blend of hydrogen peroxide and ammonium hydroxide). SC-1, SC-2 and Piranha are described, for example, in S. Wolf and R. Tauber, *Silicon Processing For The VLSI Era, Vol. 1: Process Technology* (2d ed. 1986), pp. 128–29.

After materials I and II have been joined at the interface 15 of oxide layers 9 and 16 to form a single assembly (as depicted in FIG. 1F), the assembly is separated in the vicinity of the ion implant region 8. This separation is preferably achieved by first heating the assembly to a temperature of about 800–900° C., preferably about 850° C. for up to about one hour, preferably about 0.5 hours. During this first heating step, coalescence of the implanted ion species (e.g. hydrogen) forms microcracks cleaving the assembly in the implant region 8. The heating of the assembly must be at a temperature above that at which the ion bombardment was carried out. After cleavage or separation as described above, the resulting semiconductor material has the structure depicted in FIG. 1G: i.e. a base Si wafer 14 having thereon at least one oxide insulating layer (oxide layers 16 and 9 in FIG. 1G) and an active non-indigenous epitaxial SiC top layer 10 which is electrically insulated from the base wafer 14 by the at least one oxide insulating layer (shown as the combination of oxide layers 9 and 16 in FIG. 1G). SiC layer 10 is composed only of non-indigenous epitaxially grown SiC obtained as previously described. A subsequent heating of the resulting semiconductor structure depicted in FIG. 1G is then employed in which it is heated to a temperature of 1100–1200° C., preferably about 1150° C. for about 0.5 hours. The SiC layer 10 may then be polished as necessary using techniques well known to those skilled in the art. An additional epitaxial SiC layer (not shown) may also optionally be grown upon SiC layer 10.

FIGS. 2A–2G show cross-sectional views of various method steps employed in another embodiment of this invention to prepare two semiconductor structures using a single handle wafer and two base wafers. FIG. 2A depicts a structure having a first or "handle" wafer 202 which is a Si wafer having a thickness of about 0.3–1.2 mm, say about 1 mm. As shown in FIG. 2B, handle wafer 202 has a first SiC layer 104 applied to a face of the handle wafer 202, and a second SiC layer 204 applied to the opposite face of handle wafer 202. First SiC layer 104 comprises an initial conversion layer 103 and a non-indigenous epitaxial layer 105 residing thereon. Second SiC layer 204 comprises an initial conversion layer 203 and a non-indigenous epitaxial layer 205 residing thereon. Each SiC layer 104 and 204 is prepared as previously described with respect to FIGS. 1A and 1B.

FIG. 2C depicts an oxide layer 106 applied to non-indigenous SiC layer 105, and an oxide layer 206 applied to non-indigenous SiC layer 205. The oxide layers 106 and 206 are preferably each a SiO$_2$ layer which has been obtained as previously described with respect to FIG. 1C.

In FIG. 2D, the substrate of FIG. 2C has been subjected to ion bombardment, thereby implanting ions in implant region 108 and 208 (shown in dashed lines) which are located in the epitaxial layers 105 and 205, respectively. Above the implant region 108 is at least a portion 110 of the epitaxial SiC layer 105, and below the implant region 208 is at least a portion 210 of the epitaxial SiC layer 205. Ion implantation and subsequent treatment is as described above with respect to FIG. 1D. As previously described, oxide layers 106 and 206 are damaged during ion bombardment, and are replaced by oxide layers 107 and 207, which are obtained as previously described for oxide layers 106 and 206.

FIG. 2E depicts the ion implanted material of FIG. 2D (labeled VI) in proximity to a second material (labeled III) having a base wafer 115 and an oxide layer 117 applied thereto and a third material (labeled IV) having a base wafer 215 and an oxide layer 217 applied thereto. The base wafers 115 and 215 each comprises silicon, and in a preferred embodiment each is a Si wafer having a thickness of about 100–5000 μm, preferably 300–1000 μm, most preferably about 300–500 μm. The oxide layers 117 and 217 are each preferably a SiO$_2$ layer obtained as previously described with respect to oxide layers 105 and 205. Oxide layers 117 and 217 each have a thickness of about 1–25 μm, say about 10 μm. Material III is shown inverted as contemplated in the method of this invention for adjoining to material V, and material IV is also shown in proximate relation to material V prior to adjoining thereto.

The oxide layers 107 and 117 of the materials V and III, respectively, and the oxide layers 207 and 217 of the materials V and IV, respectively, are bonded as depicted in FIG. 2F to provide a single assembly. Bonding is accomplished as previously described with respect to FIGS. 1E and 1F. Inferface 125 is the bonded interface of oxide layers 107 and 117, and interface 225 is the bonded interface of oxide layers 207 and 217, as shown in FIG. 2E.

After materials III, V and IV have been joined to form a single assembly (as depicted in FIG. 2F), the assembly is separated in the vicinity of the ion implant regions 108 and 208. This separation is achieved as previously described with respect to FIGS. 1F and 1G. After cleavage or separation as described above, the resulting two semiconductor structures are as depicted in FIG. 2G: i.e. the first semiconductor structure has a base Si wafer 115 having thereon at least one oxide insulating layer (oxide layers 117 and 107 in FIG. 2G) and an active non-indigenous SiC top layer 110 which is electrically insulated from the base wafer 115 by the at least one oxide insulating layer (shown as the combination of oxide layers 117 and 107 in FIG. 2G), and the second semiconductor structure has a base Si wafer 215 having thereon at least one oxide insulating layer (oxide layers 217 and 207 in FIG. 2G) and an active non-indigenous SiC top layer 210 which is electrically insulated from the base wafer 215 by the at least one oxide insulating layer (shown as the combination of oxide layers 207 and 217 in FIG. 2G). A subsequent heating of the resulting semiconductor structures depicted in FIG. 2G is then employed in which the resulting semiconductor structures are heated to a temperature of 1100–1200° C., preferably about 1150° C. for about 0.5 hours. The SiC layers 110 and 210 of each material may then be polished using techniques well known to those skilled in the art. An additional epitaxial layer (not shown) may also optionally be grown upon SiC layers 110 and 210, respectively.

The semiconductor structure obtained from the method of this invention is particularly useful in fabricating electronic parts and instrumentation which must be used in hostile environments. In one embodiment, the semiconductor structure may be employed in connection with the fabrication of a pressure sensor useful in high temperature (e.g. 400–600° C.) applications, such as for the measurement of pressure at the exhaust portion of a jet engine. Such an embodiment is described below with reference to FIGS. 3A–3K.

FIGS. 3A–3K show cross sectional views of the various method steps employed in one embodiment of this invention to prepare a pressure sensor of this invention. In FIG. 3A, a first or "handle" wafer 302 which is preferably a Si wafer having a thickness of about 0.3–1.2 mm, preferably about 1 mm. The handle wafer 302 has a SiC layer 304 applied to a face of the handle wafer 302. The SiC layer 304 comprises a conversion layer 303 and a non-indigenous SiC layer 305. Oxide layer 306 (not shown) is initially applied to non-indigenous SiC layer 305.

As shown in FIG. 3A, the substrate has been subjected to ion bombardment, thereby implanting ions in an implant region 308 (shown in dashed lines) which is located in the non-indigenous SiC layer 305. Above the implant region 308 is at least a portion 310 of the non-indigenous SiC layer 305 and the initial oxide layer 306 (not shown) adjacent to the non-indigenous SiC layer 305. The initial oxide layer 306 is damaged during ion implantation, and has been replaced by oxide layer 309 as shown in FIG. 3A. Preparation of the material depicted in FIG. 3A is accomplished as previously described with respect to FIGS. 1A–1D. The material depicted in FIG. 3A is labeled as material VI.

FIG. 3B depicts a Si wafer 314 having a thickness of about up to 500 µm, preferably about 300–325 µm, say about 318 µm. Si wafer 314 has a lower face 321 and an upper face 319. A pressure sensor diaphragm 322 has been etched, cut or otherwise provided in the Si wafer 314, using techniques which are well known to those skilled in the art. FIG. 3C depicts the Si wafer 314 having the pressure sensor diaphragm cavity 322 after wafer 314 has been bonded at face 321 to another Si wafer 324 having a thickness of up to about 1000 µm, preferably 300–1000 µm, most preferably about 800 µm. Si wafer 324 has a passageway 325 therethrough which operatively interfaces pressure sensor diaphragm cavity 322, thereby providing a pathway for a fluid medium (e.g. aircraft engine exhaust gas) to contact pressure sensor diaphragm cavity 322 to enable measurement of the pressure of the gaseous medium. In FIG. 3C, Si wafer 314 also has an oxide layer 316 applied to Si wafer 314. Oxide layer 316 may be applied by a chemical vapor deposition process such as PECVD as previously described, or may preferably be obtained by fusing wafers 314 and 324 in an oxidizing atmosphere, thereby causing formation of oxide layer 316 which is a thermal oxide layer on the upper face 319 of wafer 314. The oxide layer 316 has a thickness of about 1–20 µm, say about 1 µm. The assembly of wafer 314 having oxide layer 316 on face 319 thereof and wafer 324 bonded to wafer 314 at face 321 thereof is labeled as material VII in FIG. 3C.

FIG. 3D depicts the ion implanted material of FIG. 3A (labeled as material VI) bonded to the second material of FIG. 3C (labeled as material VII). Material VI is shown inverted as contemplated in the method of this invention for adjoining to material VII. The oxide layers 309 and 316 of materials VI and VII, respectively, are bonded as depicted in FIG. 3D to provide a single assembly. The bonded interface 315 shows the interface between the bonded oxide layers 309 and 316. The oxide layers are bonded using techniques as previously described with respect to bonded materials I and II in FIG. 1F.

After materials VI and VII have been joined at the interface 315 of oxide layers 309 and 316 to form a single assembly (as depicted in FIG. 3D), separation at the vicinity of the ion implantation region 308 is achieved as previously described with respect to FIGS. 1F and 1G. After cleavage or separation as described above, a pressure sensor precursor is obtained having the structure depicted in FIG. 3E: i.e. a base Si wafer 324 fusion bonded to Si wafer 314, with Si wafer 314 having thereon at least one oxide insulating layer (shown in FIG. 3E as the single layer 326 which is the combination of oxide layers 316 and 309 in FIG. 3D) and an active non-indigenous SiC top layer 310 which is electrically insulated from the base wafers 314 and 324 by the oxide insulating layer 326. A subsequent heating of the resulting semiconductor material depicted in FIG. 3E is then employed in which the resulting semiconductor material is heated to a temperature of 1100–1200° C., preferably about 1150° C. for about 0.5 hours. SiC layer 310 may optionally be made thicker using an appropriate chemical vapor deposition technique such as APCVD as previously described, which provides additional SiC (which is not indigenous to the handle wafer). SiC layer 310 may be polished using techniques well known to those skilled in the art.

Figure 3F:
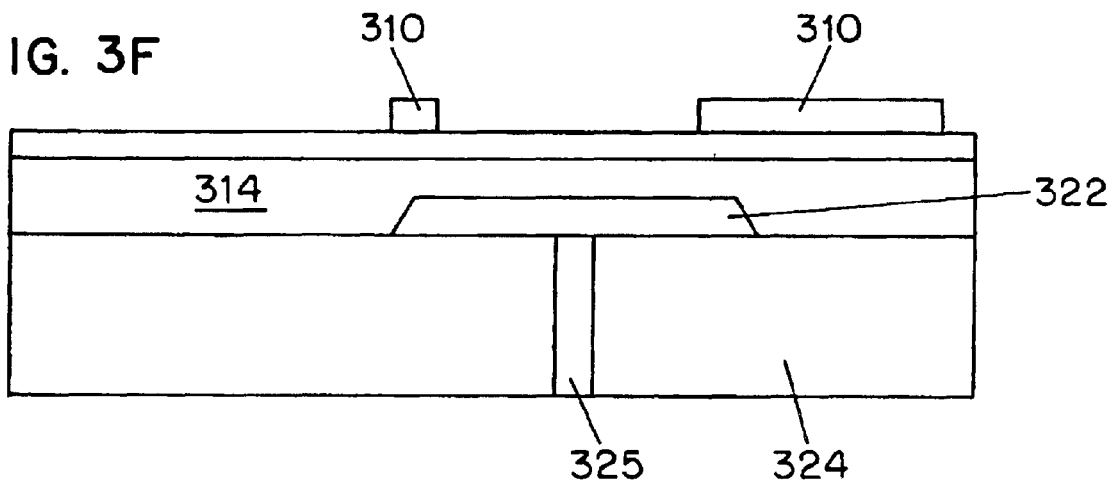

An oxide or metal film, photolithographic emulsion, mask and developer are then employed to provide a protective layer or layers (not shown) in a pattern emulating the pattern desired in SiC layer 310. The photolithographic emulsion is used to pattern the oxide or metal film which in turn is used to protect selected areas of the SiC during etching. The unprotected portion of SiC layer 310 is then selectively removed, as will be well understood by those skilled in the art. As shown in FIG. 3F, after portions of SiC layer 310 have been selectively removed, preferably using RIE, underlying portions of oxide layer 326 are exposed. Upon removal of the remaining protective layer (not shown) a passivation layer 330, preferably Si-nitride, is then applied over the exposed portions of oxide layer 326 and the remaining portions of SiC layer 310, as shown in FIG. 3G. As shown in FIG. 3H, opening 332 is provided for access to Si wafer 314, and opening 334 is provided for access to a remaining portion of SiC layer 310. Metal contact 336 is provided through opening 332 to contact Si wafer 314, and metal contact 338 is provided through opening 334 to contact SiC layer 310, as shown in FIG. 3I, thereby providing the necessary electronic connections to the semiconductor material.

To facilitate its intended use, the pressure sensor as shown in FIG. 3I is preferably adjoined or affixed to a base portion or pedestal 340 shown in FIG. 3J having a conduit 342 therethrough, as described, for example in U.S. Pat. No. 5,515,732, incorporated herein by reference. In a preferred embodiment, base portion 340 is anodically bonded to the lower face 341 of Si wafer 324 as shown. Conduit 342 is operatively associated and aligned with passageway 325 as shown in FIG. 3J to permit passage of the gaseous medium (e.g. aircraft engine exhaust gas) through conduit 342 and passageway 325 to contact pressure sensor diaphragm cavity 322 to enable measurement of the pressure of the gaseous medium. The base portion or pedestal 340 is a fabricated from a material capable of withstanding high temperatures (i.e. 300–1000° C.), such as a ceramic or SiC material. In one preferred embodiment of this invention, the base portion or pedestal is preferably fabricated from PYREX glass. In a particularly preferred embodiment, the exposed or non-bonded end 343 of base portion 340 may be metallized to facilitate further bonding or mounting (not shown). As depicted in FIG. 3K, this may be accomplished by providing one or more metal layers 344 on the exposed or non-bonded end 343 of base portion 340. This metal layer is preferably a tri-metal layer, as described, for example, in U.S. Pat. No. 5,515,732.

Figure 4E:
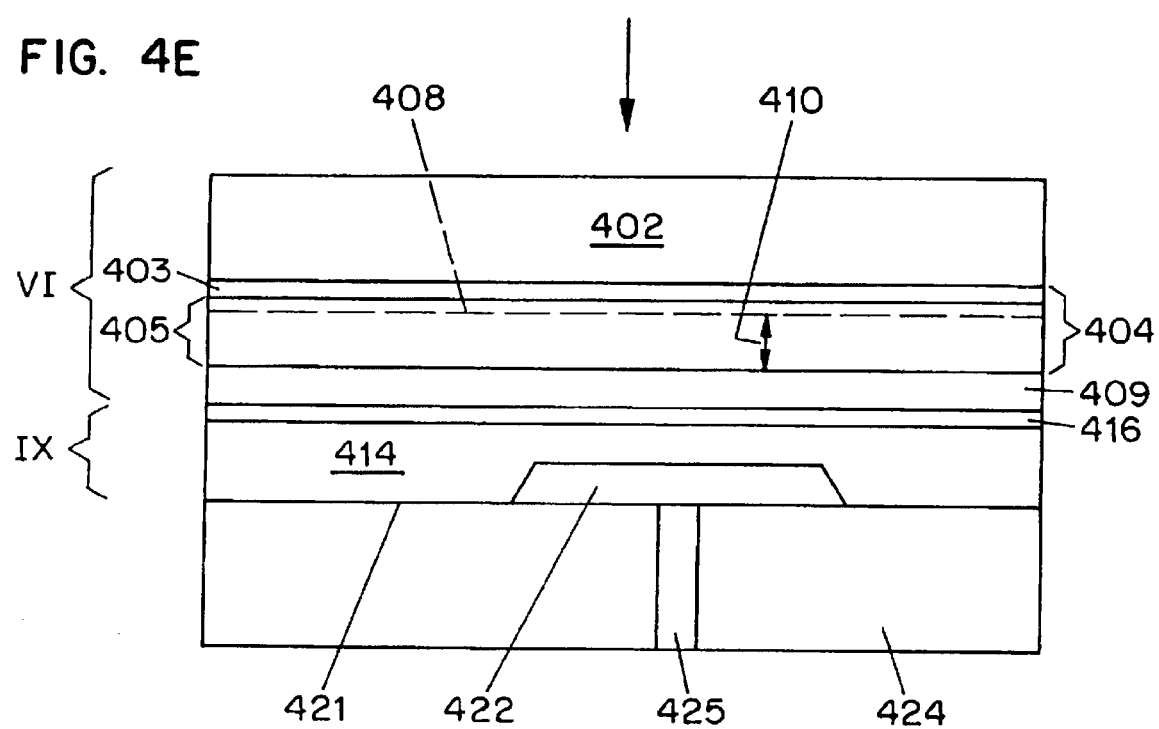

In another embodiment, as depicted in FIG. 4A, a first material may be prepared as described above with respect to FIG. 3A. FIG. 4A depicts a first or "handle" wafer 402 having a SiC layer 404 applied to a face of the handle wafer 402. The SiC layer 404 comprises a conversion layer 403 and a non-indigenous SiC layer 405. Oxide layer 406 (not shown) is initially applied to non-indigenous SiC layer 405. Implant region 408 located in layer 405 is also shown. Oxide layer 406 is damaged during ion implantation, and has been replaced by oxide layer 409. FIG. 4B depicts a Si wafer 414 having an upper surface 419 and a pressure sensor diaphragm 422 etched, cut or otherwise provided in Si wafer 414, as previously described with respect to FIG. 3B. FIG. 4C depicts an oxide layer 416 applied to the upper surface 419 of Si wafer 414. Oxide layer 416 may be applied as previously described, and has a thickness of about 1–20 µm, say about 1 µm. As shown in FIG. 4D, the ion implanted material of FIG. 4A (labeled as material VIII) is bonded to the second material of FIG. 4C (labeled as material IX) by bonding oxide layers 409 and 416 to provide a single assembly. The oxide layers 409 and 416 are bonded using techniques as previously described. After materials VIII and IX have been joined at the interface of oxide layers 409 and 416 to form a single assembly (as depicted in FIG. 4D), another Si wafer 424 having a thickness of about 100–1000 µm, preferably 300–1000 µm, most preferably about 300–500 µm is fusion bonded to face 421 of joined materials VIII and IX, as depicted in FIG. 4E. As described with respect to FIG. 3C, Si wafer 414 has a passageway 425 therethrough which operatively interfaces pressure sensor diaphragm cavity 422, thereby providing a pathway for a fluid medium (e.g. aircraft engine exhaust gas) to contact pressure sensor diaphragm cavity 422 to enable measurement of the pressure of the gaseous medium. The assembly as depicted in FIG. 4E may then be separated at the vicinity of the ion implantation region 408 and further processed as described above with respect to FIGS. 3E–3K to obtain the pressure sensor of this invention.

Although this invention has been illustrated by reference to specific embodiments, it will be apparent to those skilled in the art that various changes and modifications may be made which clearly fall within the scope of this invention.

We claim:

1. A pressure sensor prepared by a method comprising:
   (a) providing a first material comprising (i) a first wafer comprising silicon, (ii) at least one SiC conversion layer obtained by converting a portion of the silicon to SiC, (iii) at least one layer of non-indigenous SiC applied to the conversion layer, and (iv) at least one oxide layer applied to the non-indigenous SiC layer;
   (b) implanting ions in a region of the non-indigenous SiC layer, thereby establishing an implant region therein which defines a first portion of the non-indigenous SiC layer and a second portion of the non-indigenous SiC layer;
   (c) providing at least one second material comprising (i) a second wafer comprising silicon and having a pressure diaphragm cavity therein, and (ii) an oxide layer applied to a face of the second wafer;
   (d) bonding the oxide layer of the first material and oxide layer of the second material to provide an assembly of the first material and second material;
   (e) separating at the implant region the second portion of the non-indigenous SiC layer from the first portion of the non-indigenous SiC layer thereby providing a pressure sensor precursor comprising a base wafer having therein a pressure diaphragm cavity, an insulating oxide layer adjacent thereto, and a top layer of non-indigenous SiC adjacent thereto;
   (f) selectively removing portions of the non-indigenous SiC layer, thereby exposing portions of the underlying insulating oxide layer;
   (g) applying a passivation layer to the remaining portions of the non-indigenous SiC layer and the exposed underlying oxide layer;
   (h) providing at least one metallic contact which passes through the passivation layer and contacts the non-indigenous SiC layer; and
   (i) providing at least one metallic contact which passes through the passivation and oxide layers and contacts the second wafer.

2. A pressure sensor prepared by a method comprising:
   (a) providing a first material comprising (i) a first wafer comprising silicon, (ii) at least one SiC conversion layer obtained by converting a portion of the silicon to SiC, (iii) at least one layer of non-indigenous SiC applied to the conversion layer, and (iv) at least one oxide layer applied to the non-indigenous SiC layer;
   (b) implanting ions in a region of the non-indigenous SiC layer, thereby establishing an implant region therein which defines a first portion of the non-indigenous SiC layer and a second portion of the non-indigenous SiC layer;

(c) providing at least one second material comprising (i) a second wafer comprising silicon and having a pressure diaphragm cavity therein, (ii) a base portion having a conduit therethrough wherein the conduit is operatively interfaced to the pressure diaphragm cavity, and (iii) an oxide layer applied to a face of the second wafer;

(d) bonding the oxide layer of the first material and oxide layer of the second material to provide an assembly of the first material and second material;

(e) separating at the implant region the second portion of the non-indigenous SiC layer from the first portion of the non-indigenous SiC layer thereby providing a pressure sensor precursor comprising a base wafer having therein a pressure diaphragm cavity, an insulating oxide layer adjacent thereto, and a top layer of non-indigenous SiC adjacent thereto;

(f) selectively removing portions of the non-indigenous SiC layer, thereby exposing portions of the underlying insulating oxide layer;

(g) applying a passivation layer to the remaining portions of the non-indigenous SiC layer and the exposed underlying oxide layer;

(h) providing at least one metallic contact which passes through the passivation layer and contacts the non-indigenous SiC layer; and (i) providing at least one metallic contact which passes through the passivation and oxide layers and contacts the second wafer.

3. A pressure sensor prepared by a method comprising:

(a) providing a first material comprising (i) a first wafer comprising silicon, (ii) a SiC conversion layer applied to at least one face of the first wafer; (iii) a layer of non-indigenous SiC applied to the conversion layer; and (iv) an oxide layer applied to the non-indigenous SiC layer;

(b) implanting ions in a region of the non-indigenous SiC layer, thereby establishing an implant region therein which defines a first portion of the non-indigenous SiC layer and a second portion of the non-indigenous SiC layer;

(c) providing a second material comprising (i) a second wafer comprising silicon and having a pressure diaphragm cavity therein, and (ii) an oxide layer applied to a face of the second wafer;

(d) bonding the oxide layer of the first material and oxide layer of the second material to provide an assembly of the first material and second material;

(e) affixing to the second material a base portion having a first and second face and a conduit portion therethrough such that the conduit operatively interfaces the pressure diaphragm cavity;

(f) separating at the implant region the second portion of the non-indigenous SiC layer from the first portion of the non-indigenous SiC layer, thereby providing a pressure sensor precursor comprising a base wafer having therein a pressure diaphragm cavity, an insulating oxide layer adjacent thereto, and a top layer of non-indigenous SiC adjacent thereto;

(g) selectively removing portions of the non-indigenous SiC layer, thereby exposing portions of the underlying oxide layer;

(h) applying a passivation layer to the remaining portions of the non-indigenous SiC layer and the exposed underlying oxide layer;

(i) providing at least one metallic contact which passes through the passivation layer and contacts the non-indigenous SiC layer; and (j) providing at least one metallic contact which passes through the passivation and insulating oxide layers and contacts the second wafer.

4. The pressure sensor of any of claims 1–3, in which the oxide layer of the first material is an $SiO_2$ layer.

5. The pressure sensor of any of claims 1–3, in which the ions are hydrogen ions, boron ions, carbon ions, phosphorus ions, nitrogen ions, arsenic ions or fluorine ions.

6. The pressure sensor of claim 5, in which the ions are hydrogen gas ions.

7. The pressure sensor of any of claims 1–3, in which the temperature of the first material during implantation is kept below the temperature at which gas produced by the implanted ions can escape from the first material by diffusion.

8. A semiconductor structure precursor comprising:

(a) a first wafer comprising silicon;

(b) a layer of indigenous SiC residing upon the first wafer;

(c) a layer of non-indigenous SiC residing upon the layer of indigenous SiC, wherein the non-indigenous SiC layer comprises implanted ions defining first and second portions of the non-indigenous SiC layer; and (d) an oxide layer residing upon the non-indigenous SiC layer.

9. A semiconductor precursor assembly comprising:

(a) a first wafer comprising silicon;

(b) a layer of indigenous SiC residing upon the first wafer;

(c) a layer of non-indigenous SiC residing upon the layer of indigenous SiC, wherein the non-indigenous SiC layer comprises implanted ions defining first and second portions of the non-indigenous SiC layer;

(d) an oxide layer residing upon the non-indigenous SiC layer; and (e) a second wafer comprising silicon residing upon the oxide layer.

10. A semiconductor structure precursor comprising:

(a) a first wafer comprising silicon, wherein the first wafer has a first face and a second face;

(b) a first layer of indigenous SiC residing upon the first face of the first wafer;

(c) a first layer of non-indigenous SiC residing upon the first layer of indigenous SiC, wherein the first layer of non-indigenous SiC comprises implanted ions defining first and second portions of the first layer of non-indigenous SiC;

(d) a first oxide layer residing upon the first non-indigenous SiC layer;

(e) a second layer of indigenous SiC residing upon the second face of the first wafer;

(f) a second layer of non-indigenous SiC residing upon the second layer of indigenous SiC, wherein the second layer of non-indigenous SiC comprises implanted ions defining first and second portions of the second layer of non-indigenous SiC; and (g) a second oxide layer residing upon the second non-indigenous SiC layer.

11. A semiconductor precursor assembly comprising:

(a) a first wafer comprising silicon, wherein the first wafer has a first face and a second face;

(b) a first layer of indigenous SiC residing upon the first face of the first wafer;

(c) a first layer of non-indigenous SiC residing upon the first layer of indigenous SiC, wherein the first layer of non-indigenous SiC comprises implanted ions defining first and second portions of the first layer of non-indigenous SiC;

(d) a first oxide layer residing upon the first non-indigenous SiC layer;

(e) a second layer of indigenous SiC residing upon the second face of the first wafer;

(f) a second layer of non-indigenous SiC residing upon th second layer of indigenous SiC, wherein the second layer of non-indigenous SiC comprises implanted ions defining first and second portions of the second layer of non-indigenous SiC;

(g) a second oxide layer residing upon the second non-indigenous SiC layer;

(h) a second wafer comprising silicon residing upon the first oxide layer; and (i) a third wafer comprising silicon residing upon the second oxide layer.

12. A pressure sensor precursor assembly comprising:

(a) a first wafer comprising silicon, wherein the first wafer has a passageway therethrough;

(b) a second wafer comprising silicon residing upon the first wafer, wherein the second wafer has a diaphragm cavity therein, and the diaphragm cavity operatively interfaces the passageway to provide a pathway for a fluid medium to contact the diaphragm cavity;

(c) an oxide layer residing upon the second wafer;

(d) a layer of non-indigenous SiC residing upon the oxide layer, wherein the layer of non-indigenous SiC comprises implanted ions defining first and second portions of the non-indigenous SiC layer;

(e) a layer of indigenous SiC residing upon the layer of non-indigenous SiC; and (f) a third wafer comprising silicon residing upon the layer of indigenous SiC.

13. A pressure sensor precursor assembly comprising:

(a) a first wafer comprising silicon, wherein the first wafer has a pressure sensor diaphragm cavity therein;

(b) an oxide layer residing upon the first wafer;

(c) a layer of non-indigenous SiC residing upon the oxide layer, wherein the layer of non-indigenous SiC comprises implanted ions defining first and second portions of the non-indigenous SiC layer, (d) a layer of indigenous SiC residing upon the layer of non-indigenous SiC; and (e) a second wafer comprising silicon residing upon the layer of indigenous SiC.

14. A pressure sensor comprising:

(a) a base portion having a conduit therethrough;

(b) a first wafer comprising silicon, and having a passageway therethrough, wherein the first wafer resides upon the base portion and the conduit and passageway operatively interface;

(c) a second wafer comprising silicon residing upon the first wafer, wherein the second wafer has a diaphragm cavity therein, and the diaphragm cavity operatively interfaces the passageway to provide a pathway for a fluid medium to contact the diaphragm cavity;

(d) an oxide layer residing upon the second wafer;

(e) at least one portion of non-indigenous SiC residing on the oxide layer;

(f) a passivation layer residing upon the oxide layer and the portion of non-indigenous SiC;

(g) at least one first metal contact which penetrates through the passivation layer and oxide layer and is in electrical connection to the second wafer; and (h) at least one second metal contact which penetrates through the passivation layer and is in electrical connection to at least one portion of non-indigenous SiC.

* * * * *